April 23, 1968 R. H. GRAHAM 3,379,988

COMPLEMENTARY PAIR FEEDBACK AMPLIFIER

Filed Dec. 4, 1964

INVENTOR.
RICHARD H. GRAHAM

BY

Roland A. Anderson

ATTORNEY

United States Patent Office 3,379,988
Patented Apr. 23, 1968

3,379,988

COMPLEMENTARY PAIR FEEDBACK AMPLIFIER

Richard H. Graham, Glastonbury, Conn., assignor to the United States of America as represented by the United States Atomic Energy Commission Filed Dec. 4, 1964, Ser. No. 416,170
10 Claims. (Cl. 330—17)

ABSTRACT OF THE DISCLOSURE

Transistor amplifier, including a complementary pair of direct coupled NPN and PNP transistors are provided with a negative feedback network interconnecting the respective base and emitter electrodes of the transistors to form a high frequency, wide-band pulse amplifier. The feedback loop includes serially connected resistive and Zener diode elements with a bypass capacitor arranged in parallel with the diode to provide, together with the negative feedback element, a constant biased potential at the base electrodes.

Figure 1:
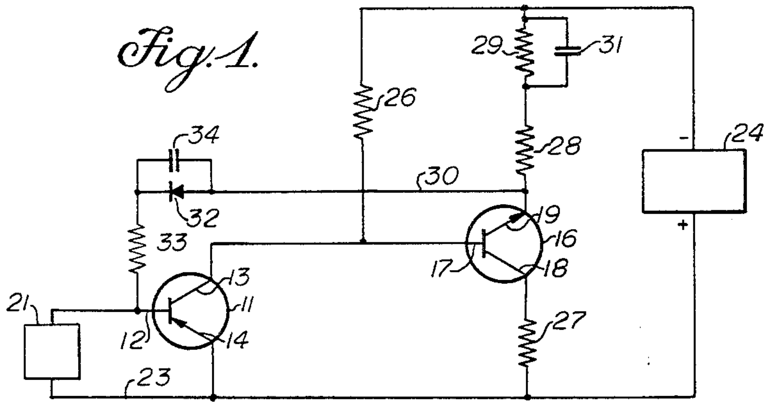

This invention relates generally to semiconductor amplifiers and more particularly to a complementary-pair amplifier circuit employing negative feedback which is capable of amplifying extremely fast random pulses.

Although there are numerous amplifiers employing transistors which are capable of amplifying fast random pulses, those presently known possess certain inherent disadvantages which the present invention overcomes. For example, existing amplifiers employ an extensive number of components, consume considerable power in standby, possess numerous time constants which give rise to undesirable rate shifts, and are generally designed to operate in a limited frequency range.

A negative feedback circuit can extend the high frequency response of conventional electronic amplifiers to some extent; however, high frequency response ultimately is limited to undesirable low levels by time constants in the amplifier circuit. In the frequency region where circuit time constants limit the frequency response, feedback circuitry is no longer effective to extend the frequency response of an amplifier.

In accord with the present invention, a pair of direct coupled complementary transistors are arranged to act in cooperation with a negative feedback circuit and form a two-stage pulse amplifier, having a minimum number of components, which is characterized by a heretofore unavailable high frequency response. The unique circuit arrangement of the present invention substantially eliminates those frequency limiting time constants which appear in prior art amplifiers. In fact, other than those time constants inherent in the transistors, the instant amplifier contains no imposing significant time constants, which limit frequency response, except in the particular case where it becomes necessary to capacitively couple a signal source to this amplifier. A time constant due to such a coupling capacitor may easily be made very small. Having eliminated those frequency limiting time constants, it has been found that such an amplifier when combined with negative feedback has a frequency response which is extended into the hundred megacycle region. In the absence of negative feedback, the amplifier will have a frequency response in the 30 megacycle region. It is seen that with unique amplifier arrangement co-acting with a negative feedback circuit, the pulse frequency response is enhanced to a substantial degree over prior art pulse amplifiers.

Moreover, this amplifier has the additional advantage that, by its very nature, very few components are required. The unique circuit arrangement which includes direct coupling between stages and the use of complementary transistors accounts for this economy of components. In the basic circuit, only two transistors, and three resistors, are used. Further, this complementary transistor feature and the unique circuit arrangement result in a minimum standby power consumption. Another advantage of the present invention lies in the fact that it is easily adapted to receive pulses of either polarity. By merely interchanging the two complementary transistors and reversing the power supply polarity, the amplifier is converted to receive pulses of opposite polarity.

Therefore, a major object of this invention is to provide an amplifier which can faithfully amplify fast random pulses.

More particularly, it is an object of this invention to provide an amplifier having a wide frequency range of operation.

Another object of this invention is to provide a pulse amplifier characterized by circuit simplicity and a low standby power consumption.

It is another object of this invention to provide a pulse amplifier whose gain is relatively independent of temperature variations.

Figure 2:
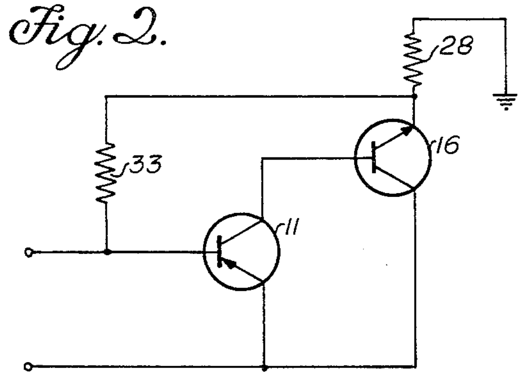

Further objects and adavntages will be readily apparent from the following description of the invention and from the drawings in which:

FIGURE 1 is a schematic diagram of a preferred embodiment of the present invention; and FIGURE 2 is a simplified AC equivalent circuit of the amplifier shown in FIGURE 1.

Referring now to the schematic diagram of FIGURE 1, the amplifier is constructed of two transistors complementary in character to each other; namely, a first, PNP, transistor 11 having a base electrode 12, collector electrode 13, and emitter electrode 14, and a second, NPN, transistor 16 having a base electrode 17, collector electrode 18, and emitter electrode 19. Input signal generator 21 has a first terminal connected to base 12 of transistor 11 and a second terminal connected to the emitter 14 through common lead 23. DC bias voltage is supplied from the negative side of a DC power supply 24 through a load resistor 26 to collector 13, the other side of the power supply being connected to common lead 23. Base 17 of transistor 16 is directly coupled to collector 13. Collector 18 connects through resistive load 27 common lead 23. Emitter 19 is connected through series resistors 28 and 29 to the negative side of power supply 24 which thereby properly biases transistor 16. Bypass capacitor 31 is shunted across resistor 29 so that it does not limit the amplifier dynamic range.

To enhance the amplifier's frequency range of operation, a negative feedback path 30 is provided from transistor 16 to transistor 11. Path 30 is completed by connecting emitter 19 to the anode of a Zener diode 32. The cathode of diode 32 is connected to a first end of resistor 33, with the second end of resistor 33 connected to the base 12 of transistor 11. Capacitor 34 in parallel connection with Zener diode 32 serves to eliminate noise current components generated in the Zener diode circuit when it is operating under low current conditions, and also serves to AC-bypass the diode.

In operation of the amplifier, transistor 11, which is connected in the common emitter configuration, receives an input signal at its base 12 and reproduces this signal in amplified form at its collector 13. Transistor 16, which is complementary in character to transistor 11, is also connected in the common emitter configuration. It receives the amplified signal from collector 13 at its own base 17 and presents a further amplified signal at collector 18 across load 27. Note that the output signal may also be derived from emitter 19 or any other convenient location thus eliminating the need for load resistor 27. In such a case, collector 18 could then be connected directly to common lead 23.

A feedback signal passing from emitter 19 of transistor 16 through diode 32 and resistor 33 to base 12 of transistor 11 serves to compare the output signal with the input signal and compensates for any distortion introduced by non-linearities in transistors 11 and 16. Although a certain amount of amplification is lost by the utilization of feedback, the extended frequency response more than compensates for this loss.

At this point it should be noted that this feedback circuit, operating in conjunction with the uniquely-arranged direct-coupled complementary pair of transistors, is a paramount structural feature of the present invention. It is the cooperation of these two features which permits the extremely high frequency response of the pulse amplifier.

Zener diode 32 assures that a constant DC voltage drop exists between emitter 19 and base 12. In certain applications, resistor 33 may be able to sustain this DC voltage drop depending on the supply voltage and component values used. In such a case, the Zener diode 32 would not be required.

Proper selection of resistors 26, 29 and 33 will assure a relatively small standby power consumption, i.e. by making resistors 26 and 29 relatively large, very little collector current flows in the absence of an input signal. Also, with appropriate selection of resistor 33 the transistors 11 and 16 will be biased to cut-off in the absence of an input signal.

The amplifier as described above will amplify negative pulses. However, the amplifier is so designed that by interchanging transistors 11 and 16, reversing the polarity of power supply 24, and reversing the polarity of diode 32, the circuit will amplify positive pulses.

In a practical embodiment the following components have been satisfactorily used:

| | | |
|---|---|---|
| Resistor **33** | ohms | 1000 |
| Resistor **26** | do | 5100 |
| Resistor **28** | do | 100 |
| Resistor **29** | do | 4600 |
| Resistor **27** (load) | do | 100 |
| Capacitor **34** | microfarads | 100 |
| Capacitor **31** | do | 100 |
| Zener diode **32** (breakdown voltage=3 v.) | | 1N705 |
| Power supply **24** | volts | 6 |

The following transistor pairs are suitable for use in this circuit:

| Transistor 11 (PNP) | Transistor 16 (NPN) | Frequency Range |
|---|---|---|
| 2N495 | 2N335 | Low |
| 2N1132 | 2N697 | Medium |
| 2N1195 | 2N706 | High |

It should be understood that the above values are given by way of example only and that the component values may vary according to the design or application.

It may be noted that this circuit uses relatively few components. The only capacitors used are capacitors 31 and 34, and these can be made sufficiently large that they do not degrade the dynamic performance of the amplifier. Also note that capacitors 31 and 34 are not fundamental to the basic circuit and could be eliminated.

As far as the AC signal is concerned, the amplifier has even fewer components. FIGURE 2 depicts a simplified AC equivalent circuit of the circuit of FIGURE 1. From the figure it can be seen that the frequency response of the amplifier is limited primarily by the transistors themselves and by the AC current feedback ratio which is the ratio of resistor 28 and resistor 33. The well-known equation for feedback amplifier current gain is as follows:

$$\text{current gain}=\frac{B_1B_2}{1+B_1B_2B}$$

where:

$B_1$=common emitter current gain of transistor 11
$B_2$=common emitter current gain of transistor 16
$B$=AC current feedback ratio, i.e., resistance of resistor 28/resistance of resistor 33 and where $B_1$ and $B_2$ are frequency dependent parameters. If B and $B_2$ are known for any particular transistors, it is a simple matter, using standard techniques, to determine the gain and phase margins and the upper corner frequency for this amplifier.

Using the components listed above and the 2N1195–2N706 transistor combination, the amplifier has a phase margin of 50 degrees when the gain is unity and a gain margin of 27 decibels when the phase shift is 180 degrees. Gain and phase margin are indications of stability. The upper corner frequency of this amplifier is $2090\times10^{16}$ radians per second or 325 megacycles. Without the feedback circuit this upper corner frequency would be approximately 30 megacycles. The lower frequency limit is approximately 100 cycles per second. This upper corner frequency indicates a capability of accurately amplifying very fast random pulses. It is well known that a series of electrical pulses, other than a sine wave, is comprised of a fundamental frequency wave plus harmonics of this fundamental frequency. If these harmonics are amplified unequally, then the pulse being amplified is distorted. If utmost high frequency performance is not required of the amplifier, more economical medium-frequency or low-frequency transistors can be used.

It is a characteristic of all transistor amplifiers that they are sensitive to temperature changes. This temperature sensitivity is caused primarily by variations in the collector cutoff current of a transistor which current roughly doubles for each increase of 8 to 10 degrees centigrade in temperature. Since this collector cutoff current traverses the base-emitter junction of the transistor, it is amplified according to the beta of the transistor and has the same effect as though an equivalent current equal to the collector cutoff current were fed into the base. By injecting a current into the base equal in amplitude but opposite in polarity to the collector cutoff current, the transistor gain variations with varying temperature are minimized.

The gain of the amplifier of the present invention can be stabilized against these temperature variations by replacing a portion of resistor 29 with a temperature dependent resistor, such as a thermistor or a sinsistor, having a positive temperature coefficient of resistance. When temperature increases, the resulting increase in collector cutoff current of transistor 11 is offset by the increased resistance of resistor 29 which reduces the DC bias fed to the base of that transistor. Also, a second compensating effect is present. As the resistance of resistor 29 increases with temperature, a greater voltage drop appears across it and the emitter voltage of transistor 16 increases positively. With such a shift of the emitter voltage in the positive direction, the base to emitter voltage and current of transistor 16 is reduced. The reduced base current in turn compensates for the increased collector cutoff current of transistor 16 which also follows temperature increases.

Resistor 29 has been chosen as the temperature sensitive element since it does not affect the AC circuit. Its primary function is to provide biasing for transistor 16 and the presence of bypass capacitor 31 effectively eliminates it from the AC portion of the amplifier.

Other modifications of the present invention will be apparent to one skilled in the art. For example, the feedback loop could be tapped from the emitter of the second transistor, inverted, and then fed to the first transistor base. As another example, the amplifier can be cascaded. In light of these and other obvious modifications, the invention should be construed liberally, and it will be understood that such modifications and changes may be made without departing from the spirit and scope of the invention as defined and covered by the appended claims.

What is claimed is:

1. an electronic amplifier comprising in combination:
(a) a pair of transistors each comprising a base, an emitter, and a collector, the first of said transistors being of complementary character to the second transistor;
(b) coupling means electrically connecting said first transistor collector to the second transistor base;
(c) negative feedback means electrically connecting the output of said second transistor to the first transistor base; and
(d) means for connecting a suitable energizing source to said transistors.

2. An electronic amplifier comprising in combination:
(a) a pair of transistors, each transistor comprising a base, an emitter, and a collector, a first transistor being connected in a common emitter configuration and being of complementary character to a second transistor;
(b) a DC power source arranged to energize said transistors;
(c) coupling means electrically connecting the first transistor collector to the second transistor base;
(d) a resistive impedance interposed between the second transistor emitter and said DC power source;
(e) and feedback means electrically connecting the second transistor emitter to the first transistor base.

3. An electronic amplifier as recited in claim 2 further defined by said feedback means being a resistor electrically connected between said second transistor emitter and said first transistor base.

4. An electronic amplifier as recited in claim 2 further defined by said feedback means including a resistor in series with a reverse polarity Zener diode operating in its breakdown voltage region, and a capacitor shunting said Zener diode.

5. An electronic amplifier as recited in claim 2 wherein said resisting impedance is comprised of a first and a second resistor, and an AC conducting means connected in parallel relation with said second resistor.

6. An electronic amplifier as recited in claim 2, wherein said feedback means is comprised of a resistive element, and said resistive impedance is comprised of first and second resistors, said second resistor provided with a paralleled capacitor, and said second resistor having a positive temperature coefficient selected to effectively compensate for amplifier gain variations caused by temperature changes.

7. An electronic amplifier comprising in combination:
(a) a pair of transistors, each comprising a base, an emitter, and a collector, a first of said transistors disposed in a common collector configuration, said first transistor being of complementary character to the second transistor;
(b) means for energizing said transistors, said means including a DC power source having at least two poles;
(c) coupling means electrically connecting the first transistor collector to the second transistor base;
(d) means for electrically resistively connecting the second transistor emitter to a first pole of said power source;
(e) a resistive impedance disposed between the second transistor collector and a second pole of said power source;
(f) and feedback means electrically connecting the second transistor collector to the first transistor base.

8. A semiconductor amplifier comprising in combination:
(a) a first transistor comprising a base, an emitter, and a collector;
(b) a second transistor comprising a base, an emitter, and a collector;
(c) a first terminal means for coupling a first pole of a signal source to the base of said first transistor;
(d) a second terminal means for coupling a second pole of the signal source to the first transistor emitter;
(e) a DC power source having at least two poles, a first pole being electrically connected to said emitter of said first transistor;
(f) means for electrically connecting the first transistor collector to the second transistor base;
(g) a first resistor electrically connected between the first transistor collector and a second pole of the power source;
(h) a resistive impedance electrically connected between the second transistor emitter and the power source second pole;
(i) feedback means electrically connecting the second transistor emitter to the first transistor base;
(j) direct current means for electrically connecting the second transistor collector to said emitter of said first transistor; and
(k) output terminal means coupled in the emitter circuit of said second transistor.

9. A semiconductor amplifier as recited in claim 8, wherein said resistive impedance is comprised of a second and third serially connected resistor, wherein said third resistor is provided with a shunting capacitor; and wherein said feedback means is comprised of a fourth resistor in series with an AC-bypassed, reverse-poled Zener diode operating in its breakdown voltage region, said fourth resistor having a resistance approximately one order of magnitude larger than the resistance of said second resistor.

10. A semiconductor amplifier as recited in claim 8, wherein said resistive impedance is a combination comprising at least a second resistor in series with a third resistor wherein said third resistor is provided with a shunting capacitor, said third resistor having a positive temperature coefficient selected to stabilize the first and second transistor bias and gain parameters against temperature variations.

References Cited

UNITED STATES PATENTS

| | | | |
|---|---|---|---|
| 3,030,504 | 4/1962 | Oschmann | 330—29 |
| 3,292,095 | 12/1966 | Duff | 330—17 |

ROY LAKE, *Primary Examiner.*

E. FOLSOM, *Assistant Examiner.*